(12) United States Patent
Ishida et al.

(10) Patent No.: US 10,600,982 B2
(45) Date of Patent: Mar. 24, 2020

(54) ELECTROLUMINESCENCE DEVICE AND METHOD FOR PRODUCING SAME

(71) Applicant: Sharp Kabushiki Kaisha, Sakai, Osaka (JP)

(72) Inventors: Mamoru Ishida, Sakai (JP); Tetsuya Okamoto, Sakai (JP); Takeshi Hirase, Sakai (JP); Takashi Ochi, Sakai (JP); Tohru Senoo, Sakai (JP); Tohru Sonoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/762,132

(22) PCT Filed: Sep. 26, 2016

(86) PCT No.: PCT/JP2016/078172
§ 371 (c)(1),
(2) Date: Mar. 22, 2018

(87) PCT Pub. No.: WO2017/057227
PCT Pub. Date: Apr. 6, 2017

(65) Prior Publication Data
US 2018/0261787 A1 Sep. 13, 2018

(30) Foreign Application Priority Data
Oct. 1, 2015 (JP) .................................. 2015-196162

(51) Int. Cl.
*H01L 51/00* (2006.01)
*H01L 51/50* (2006.01)
(Continued)

(52) U.S. Cl.
CPC ...... *H01L 51/5036* (2013.01); *H01L 27/3262* (2013.01); *H01L 51/0097* (2013.01);
(Continued)

(58) Field of Classification Search
None
See application file for complete search history.

(56) References Cited

U.S. PATENT DOCUMENTS

| | | | | |
|---|---|---|---|---|
| 2006/0132030 A1* | 6/2006 | Gao | ................... | H01L 51/5237 313/511 |
| 2010/0308335 A1* | 12/2010 | Kim | ................... | H01L 27/3244 257/59 |
| 2016/0028032 A1* | 1/2016 | Okada | ................. | H01L 51/0097 257/40 |

FOREIGN PATENT DOCUMENTS

| | | |
|---|---|---|
| JP | 2005-311171 A | 11/2005 |
| JP | 2008-525965 A | 7/2008 |

(Continued)

OTHER PUBLICATIONS

Official Communication issued in International Patent Application No. PCT/JP2016/078172, dated Dec. 13, 2016.

*Primary Examiner* — Hung K Vu
(74) *Attorney, Agent, or Firm* — Keating & Bennett, LLP

(57) ABSTRACT

In an organic EL display device that includes a base material having flexibility and an organic EL element (electroluminescence element) provided on the base material, a sealing film is formed that seals the organic EL element. Additionally, a first adjustment layer and a second adjustment layer, which are configured of materials having the same thickness and the same Young's modulus and are configured to adjust a neutral surface of the organic EL display device, are each provided at an end portion on one side and an end portion on another side of the organic EL display device in a film thickness direction T.

11 Claims, 6 Drawing Sheets

(51) Int. Cl.
  *H01L 27/32* (2006.01)
  *H01L 51/52* (2006.01)
  *H01L 51/56* (2006.01)

(52) U.S. Cl.
  CPC ...... *H01L 51/5218* (2013.01); *H01L 51/5234* (2013.01); *H01L 51/56* (2013.01); *H01L 27/322* (2013.01); *H01L 27/323* (2013.01); *H01L 27/3244* (2013.01); *H01L 51/5246* (2013.01); *H01L 2251/5338* (2013.01); *H01L 2251/558* (2013.01); *Y02E 10/549* (2013.01)

(56) References Cited

FOREIGN PATENT DOCUMENTS

| JP | 2010-244694 A | 10/2010 |
| JP | 2010-282966 A | 12/2010 |
| JP | 2011-075798 A | 4/2011 |
| WO | 2014/136259 A1 | 9/2014 |

\* cited by examiner

ELECTROLUMINESCENCE DEVICE AND METHOD FOR PRODUCING SAME

TECHNICAL FIELD

The disclosure relates to an electroluminescence device having an electroluminescence (EL) element and to a method for producing the electroluminescence device.

BACKGROUND ART

In recent years, flat panel displays have been utilized in various products and fields, and there are demands for flat panel displays having even larger sizes, even higher picture quality, and even lower power consumption.

In view of such circumstances, organic electroluminescence (referred to as EL below) display devices provided with organic EL elements utilizing the electro luminescence of organic materials are attracting much attention as flat panel displays due to their excellent qualities, such as low voltage driving, high responsiveness, and self-luminosity, while being in a completely solid state.

For example, in the case of an active-matrix organic EL display device, a thin-filmed organic EL element is disposed on a substrate on which thin film transistors (TFT) are provided. The organic EL element includes an organic EL layer including a light-emitting layer layered between a pair of electrodes. The TFT is connected with either side of the pair of electrodes. Then, voltage is applied across the pair of electrodes to make the light-emitting layer emit light, whereby image display is performed.

Additionally, in the known organic EL display device as described above, in order to configure a device capable of being repeatedly bent (being bendable), it is known that a base material having flexibility is used as a support substrate for supporting the above-described organic EL element.

Furthermore, the known organic EL display device as described above, as disclosed in PTL 1 indicated below, for example, includes a base material having flexibility and an organic EL element fixed on this base material. Additionally, in this known organic EL display device, it is proposed to fix a cover layer having flexibility on the organic EL element, and to set a Young's modulus and a thickness of the cover layer such that a neutral surface of the organic EL display device is positioned in the vicinity of the organic EL element. Additionally, it is stated that, in this known organic EL display device, even in a case where the organic EL display device is bent, it is possible to suppress distortion or the like of the organic EL element from occurring and to prevent reliability from being reduced.

CITATION LIST

Patent Literature

PTL 1: JP 2005-311171 A

SUMMARY

Technical Problem

Incidentally, in this kind of known organic EL display device described above, in order to prevent deterioration of the organic EL element (electroluminescence element) caused by moisture or oxygen, a sealing film is known to be provided for the organic EL element to enhance reliability.

However, in the above-described known organic EL display device, in a case where the above-described sealing film or the like is provided and the number of a plurality of layers included in the organic EL display device is increased, it is difficult to adjust a position of the above-described neutral surface. As a result, in this known organic EL display device, in a case where the organic EL display device is bent, there are problems that film breakage or the like occurs in the organic EL element or any layer of other plurality of layers, and abnormality such as damage or the like occurs in the organic EL display device.

In view of the above-described problems, an object of the disclosure is to provide an electroluminescence device with excellent reliability capable of preventing abnormality from occurring even in a case where the number of a plurality of layers included in the device is increased, and a method for producing the electroluminescence device.

Solution to Problem

In order to accomplish the above-described object, an electroluminescence device according to the disclosure is an electroluminescence device including a base material having flexibility, and a plurality of layers including an electroluminescence element provided on the base material, the plurality of layers further including:

a sealing film configured to seal the electroluminescence element;

a first adjustment layer provided at an end portion of the electroluminescence device on one side in a film thickness direction and configured to adjust a neutral surface of the electroluminescence device; and a second adjustment layer provided at an end portion of the electroluminescence device on another side in the film thickness direction and configured to adjust a neutral surface of the electroluminescence device, wherein the first adjustment layer and the second adjustment layer use such materials that have the same thickness and the same Young's modulus.

In the electroluminescence device having the configuration stated above, the sealing film seals the electroluminescence element. Additionally, the first adjustment layer is provided at the end portion of the electroluminescence device on the one side in the film thickness direction, and adjusts the neutral surface of the electroluminescence device. Additionally, the second adjustment layer is provided at the end portion of the electroluminescence device on the other side in the film thickness direction, and adjusts the neutral surface of the electroluminescence device. Furthermore, for the first adjustment layer and the second adjustment layer, the materials having the same thickness and the same Young's modulus are used. Thus, unlike the known example stated above, this allows the electroluminescence device with excellent reliability to be configured that can prevent abnormality from occurring even in a case where the number of the plurality of layers included in the device is increased.

Additionally, in the above-described electroluminescence device, the first and second adjustment layers preferably adjust a position of the neutral surface to a position with a distance from the center position of the electroluminescence device in the film thickness direction to a position of the neutral surface becoming 1/n times or smaller the distance, when a value satisfying Inequality (1) indicated below and being greater than 1 is represented by n.

[Expression 1]

$$n - 1 \leq \frac{2E_x t_x}{\sum_{i=1}^{m} E_i t_i} \quad (1)$$

Note that, Ex and tx are a Young's modulus and a thickness, respectively, of each of the first and second adjustment layers. Additionally, m is the number of layers included in the plurality of layers after excluding the first and second adjustment layers from the plurality of layers, Ei and ti are a Young's modulus and a thickness, respectively, of each of the plurality of layers excluding the first and second adjustment layers.

In this case, by the first and second adjustment layers, the position of the neutral surface can be reliably brought close to the center position of the electroluminescence device in the film thickness direction, and thus, even in a case where the electroluminescence device is bent, it is possible to reliably prevent abnormality from occurring.

Additionally, in the above-described electroluminescence device, for each of the first and second adjustment layers, a material having the Young's modulus of 1 GPa or greater is preferably used.

In this case, without increasing the thickness of each of the first and second adjustment layers, the position of the neutral surface can be adjusted with ease.

Additionally, in the above-described electroluminescence device, for each of the first and second adjustment layers, a carbon material or a material with a carbon material being dispersed in an organic resin may be used.

In this case, each of the first and second adjustment layers is configured of the material with the high Young's modulus, and thus each of the first and second adjustment layers can be reduced in the thickness, and the electroluminescence device can be reduced in the thickness with ease.

Additionally, in the above-described electroluminescence device, for the carbon material of each of the first and second adjustment layers, graphite, graphene, a carbon nanohorn, a carbon nanofiber, or a carbon nanotube may be used.

In this case, a material having high thermal conductivity is used for each of the first and second adjustment layers, heat from the electroluminescence element can be more efficiently radiated to the exterior.

Additionally, in the above-described electroluminescence device, for each of the first and second adjustment layers, an inorganic layer may be used.

In this case, without using an adhesive material layer, each of the first and second adjustment layers can be provided, and thus the electroluminescence device can be reduced in the thickness with ease.

Additionally, in the above-described electroluminescence device, for the inorganic layer of each of the first and second adjustment layers, silicon nitride (SiNx), silicon oxide (SiOx), silicon oxynitride (SiON), or aluminum oxide (AlOx) may be used.

In this case, the electroluminescence device with an excellent barrier property capable of easily preventing moisture, oxygen, or the like from the exterior from penetrating can be configured with ease.

Additionally, the above-described electroluminescence device may include an opposite base material configured to oppose the base material on the electroluminescence element side, and a sealing material having a frame shape and configured to seal the electroluminescence element between the base material and the opposite base material.

In this case, deterioration of the electroluminescence element can be more reliably inhibited.

Additionally, in the above-described electroluminescence device, a touch panel may be provided between the first adjustment layer and the second adjustment layer.

In this case, the electroluminescence device with the touch panel having excellent bendability and reliability can be configured with ease.

Additionally, a method for producing an electroluminescence device of the disclosure is a method for producing an electroluminescence device including a base material having flexibility and a plurality of layers including an electroluminescence element provided on the base material, the method includes:

forming a sealing film to form a sealing film configured to seal the electroluminescence element, and providing first and second adjustment layers to respectively provide a first adjustment layer and a second adjustment layer configured of materials having the same thickness and the same Young's modulus and configured to adjust a neutral surface of the electroluminescence device at an end portion on one side and an end portion on another side of the electroluminescence device in a film thickness direction.

In the method for producing the electroluminescence device configured as described above, by the forming a sealing film, the electroluminescence element is sealed by the sealing film. Additionally, by the providing first and second adjustment layers, the first adjustment layer and second adjustment layer, which are configured of the materials having the same thickness and the same Young's modulus and configured to adjust the neutral surface of the electroluminescence device, are provided at the end portion on the one side and the end portion on the other side of the electroluminescence device in the film thickness direction. Thus, unlike the known example stated above, this allows the electroluminescence device with excellent reliability to be configured that can prevent abnormality from occurring even in a case where the number of the plurality of layers included in the device is increased.

Additionally, in the above-described method for producing the electroluminescence device, in the providing first and second adjustment layers, by providing the first and second adjustment layers, a position of the neutral surface is preferably adjusted to a position with a distance from the center position of the electroluminescence device in the film thickness direction to a position of the neutral surface becoming 1/n times or smaller the distance, when a value satisfying Inequality (1) indicated below and being greater than 1 is represented by n.

[Expression 1]

$$n - 1 \leq \frac{2E_x t_x}{\sum_{i=1}^{m} E_i t_i} \quad (1)$$

Note that, Ex and tx are a Young's modulus and a thickness, respectively, of each of the first and second adjustment layers. Additionally, m is the number of layers included in the plurality of layers after excluding the first and second adjustment layers from the plurality of layers, Ei and ti are a Young's modulus and a thickness, respectively, of each of the plurality of layers excluding the first and second adjustment layers.

In this case, by the first and second adjustment layers, the position of the neutral surface can be reliably brought close to the center position of the electroluminescence device in the film thickness direction, and thus, even in a case where the electroluminescence device is bent, it is possible to reliably prevent abnormality from occurring.

Advantageous Effects of Disclosure

According to the disclosure, an electroluminescence device with excellent reliability capable of preventing abnormality from occurring even in a case where the number of a plurality of layers included in the device is increased and a method for producing the electroluminescence device can be provided.

DESCRIPTION OF EMBODIMENTS

Below, embodiments of an electroluminescence device and a method for producing the electroluminescence device according to the disclosure will be described with reference to the drawings. Note that the following description will be made by giving an example in which the disclosure is applied to an organic EL display device. In addition, in each of the drawings, the dimensions of constituent elements are not precisely illustrated as the actual dimensions of the constituent elements and the dimensional proportions of each of the constituent elements.

First Embodiment

Figure 1:
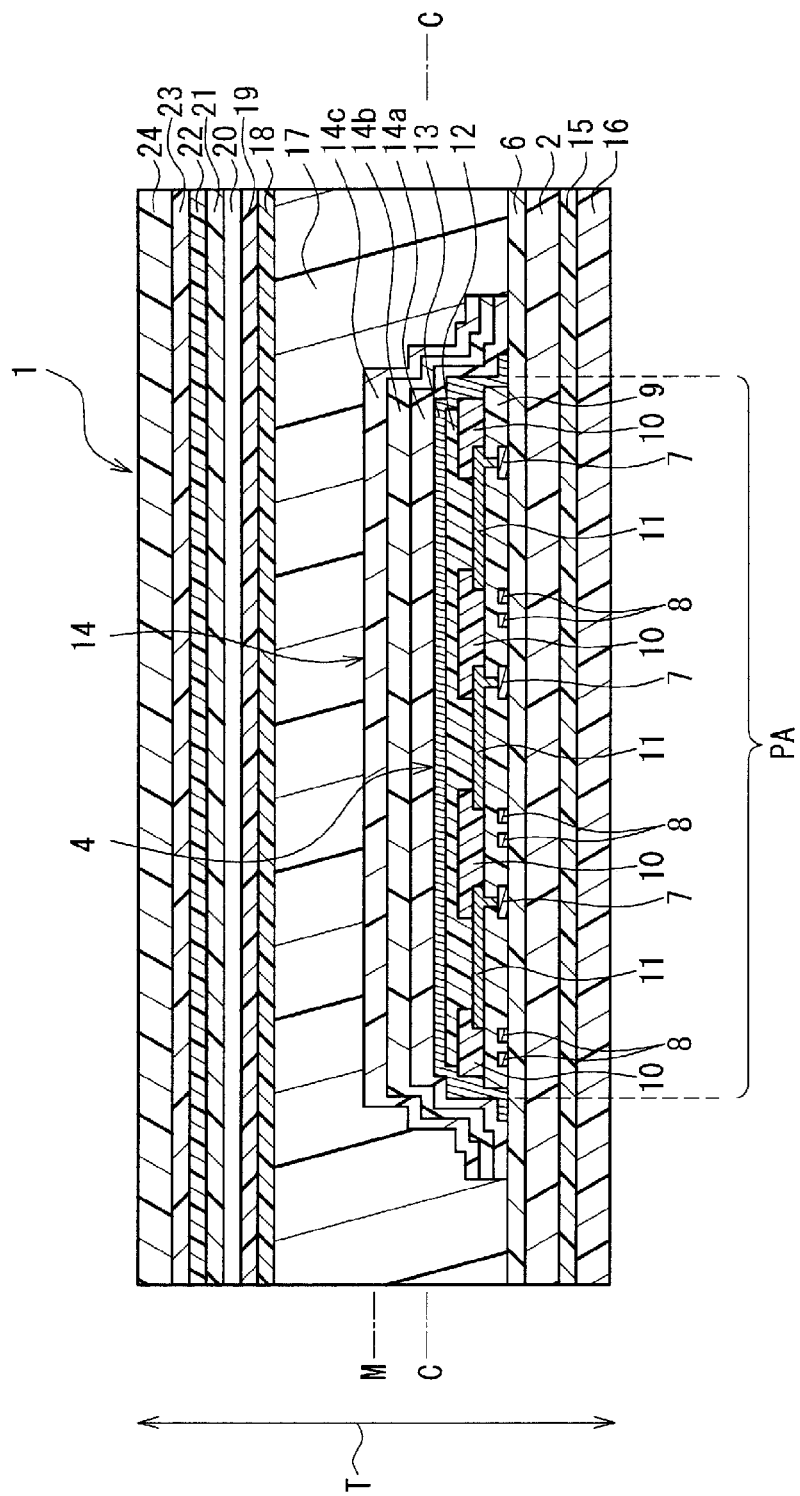
FIG. 1 is a cross-sectional view illustrating a cross section of an organic EL display device according to a first embodiment of the disclosure.

FIG. 1 is a cross-sectional view illustrating a cross section of an organic EL display device according to a first embodiment of the disclosure. In FIG. 1, an organic EL display device 1 according to the present embodiment includes a base material 2 and an organic EL element 4 serving as an electroluminescence element disposed on the base material 2.

Further, in the organic EL display device 1 of the present embodiment, the organic EL element 4 configures a rectangular pixel area PA that has a plurality of pixels (including a plurality of sub pixels), and the organic EL element 4 is sealed by a sealing film 14. In addition, the pixel area PA forms a display unit of the organic EL display device 1 to display information. Specifically, in the pixel area PA, as will be described in more detail later, a plurality of pixels (a plurality of sub pixels) are arranged in a matrix shape, and the organic EL element 4 has a configuration in which each of the sub pixels emits light, as a result, the organic EL element 4 displays information.

Additionally, in FIG. 1, the base material 2 is configured of a flexible plastic film or the like, for example, and the organic EL display device 1 capable of being repeatedly bent is configured. In addition, the base material 2 has a foundation film (insulating layer) 6 provided covering the entire base material 2. In addition, as illustrated in FIG. 1, in the organic EL display device 1, a thin film transistor (TFT) 7 is provided on the foundation film 6 for each of the sub pixels of the pixel area PA. Moreover, wiring lines 8 including a plurality of source lines (signal lines) and a plurality of gate lines, each of which is formed in a matrix manner, are formed on the foundation film 6. Each of the source line and each of the gate line are connected with a source driver and a gate driver, respectively, (not illustrated) configured to drive the TFT 7 for each of the sub pixels according to image signals inputted from the outside. In addition, the TFT 7 functions as a switching element that controls light emission of the corresponding sub pixel, and controls the light emission in the sub pixel of each of red (R), green (G), and blue (B) made of the organic EL element 4.

Note that the foundation film 6 is provided to prevent characteristics of the TFT 7 from deteriorating due to impurity diffusion from the base material 2 to the TFT 7, and may be omitted in cases where there is no concern about such deterioration.

Additionally, in the organic EL display device 1 of the present embodiment, a moisture-proof layer, which is not illustrated, is formed on the foundation film 6 under the TFT 7. This moisture-proof layer is configured of an inorganic layer such as silicon nitride, silicon oxynitride, or the like, to prevent moisture or oxygen from penetrating (permeating) from the exterior on the base material 2 side and prevent the TFT 7 and the organic EL element 4 from deteriorating.

In addition, as illustrated in FIG. 1, an interlayer insulating film 9, an edge cover 10, and a first electrode 11 of the organic EL element 4 are formed on the base material 2. The interlayer insulating film 9 functions as a flattening film, and is formed on the foundation film 6 (on which the above-described moisture-proof layer is formed) covering the TFT 7 and the wiring lines 8. The edge cover 10 is formed on the interlayer insulating film 9 covering a pattern end portion of the first electrode 11. In addition, the edge cover 10 also functions as an insulating layer for preventing electrical short circuit between the first electrode 11 and a second electrode 13, which will be stated later. In addition, the first electrode 11 is connected with the TFT 7 via a contact hole formed in the interlayer insulating film 9.

In addition, an opening of the edge cover 10, in other words, a portion at which the first electrode 11 is exposed substantially forms a light emitting region of the organic EL element 4, and as stated above, the organic EL display device 1 according to the present embodiment is configured in a manner such that colored light with any of RGB is emitted so as to be able to perform full color display. In addition, the organic EL display device 1 according to the present embodiment is configured as an active-matrix display device including the thin film transistor (TFT) 7.

Furthermore, as illustrated in FIG. 1, an organic EL layer 12 and the second electrode 13 are formed on the first electrode 11, and the first electrode 11, the organic EL layer 12, and the second electrode 13 form the organic EL element 4. In other words, the organic EL element 4 is, for example, a light emitting element capable of emitting light at high luminance as a result of low-voltage DC power driving, and includes the first electrode 11, the organic EL layer 12, and the second electrode 13.

More specifically, in the case where the first electrode 11 is a positive electrode, a hole injecting layer, a hole transport layer, a light-emitting layer, an electron transport layer, an electron injecting layer, and the like are layered as the organic EL layer 12 from the side of the first electrode 11 (not illustrated), and the second electrode 13 is formed as a negative electrode. Alternatively, instead of the configuration stated above, it may be possible to employ a configuration in which a single layer having two or more functions such as a hole injection-cum-transport layer is formed. In addition, a carrier blocking layer or the like may be disposed in the organic EL layer 12 depending on application.

On the other hand, in the case where the second electrode 13 is a positive electrode, the order of layers in the organic EL layer 12 is reversed to that stated above.

Additionally, the organic EL display device 1 of the present embodiment is configured as a top-emitting type in which the organic EL element 4 emits light from an opposite side from the base material 2, in other words, from the sealing film 14 side. To be specific, in the organic EL element 4, the first electrode 11 is configured of a reflective electrode, the second electrode 13 is configured of a transparent electrode or a translucent electrode, the organic EL display device 1 of the present embodiment is configured to emit light from the sealing film 14 side. Specifically, in this top-emitting organic EL display device 1, the surface of each of the first electrodes 11 on the sealing film 14 side configures the substantial light emitting surface of the organic EL element 4, and is configured to emit light to the outside.

As described above, in the organic EL display device 1 according to the present embodiment, the organic EL element 4 is sealed by the sealing film 14. The sealing film 14 is configured to prevent moisture, oxygen, and the like from penetrating (permeating) from the exterior, and thus, prevent the organic EL element 4 from deteriorating.

Further, the sealing film 14 is configured by a plurality of, for example, sealing films of three layers. Specifically, as illustrated in FIG. 1, the sealing film 14 is configured by a layered structure in which a first inorganic layer 14a is provided on the organic EL element 4 side, an organic layer 14b is provided on the first inorganic layer 14a, and a second inorganic layer 14c is provided on the organic layer 14b.

Silicon nitride (SiNx), silicon oxide (SiOx), silicon oxynitride (SiON), aluminum oxide (AlOx), or the like is used in the first and second inorganic layers 14a and 14c, for example. Further, an organic silicon (organosilicon) such as polysiloxane, or silicon oxycarbide, acrylate, polyurea, Parylene, a polyimide, a polyamide, or the like is used in the organic layer 14b, for example.

Further, in the organic EL display device 1 of the present embodiment, the first inorganic layer 14a is provided on the organic EL element 4 side, and thus, an adverse influence of moisture on the organic EL element 4 is more reliably inhibited by the first inorganic layer 14a. Further, the organic layer 14b is provided on the first inorganic layer 14a, and as a result, stress on the first inorganic layer 14a can be released. Even in a case where defects such as pin holes or damage caused by foreign material occur in the first inorganic layer 14a, these can be covered by the organic layer 14b, and deterioration in the sealing performance of the sealing film 14 can be even more reliably inhibited.

Figure 2:
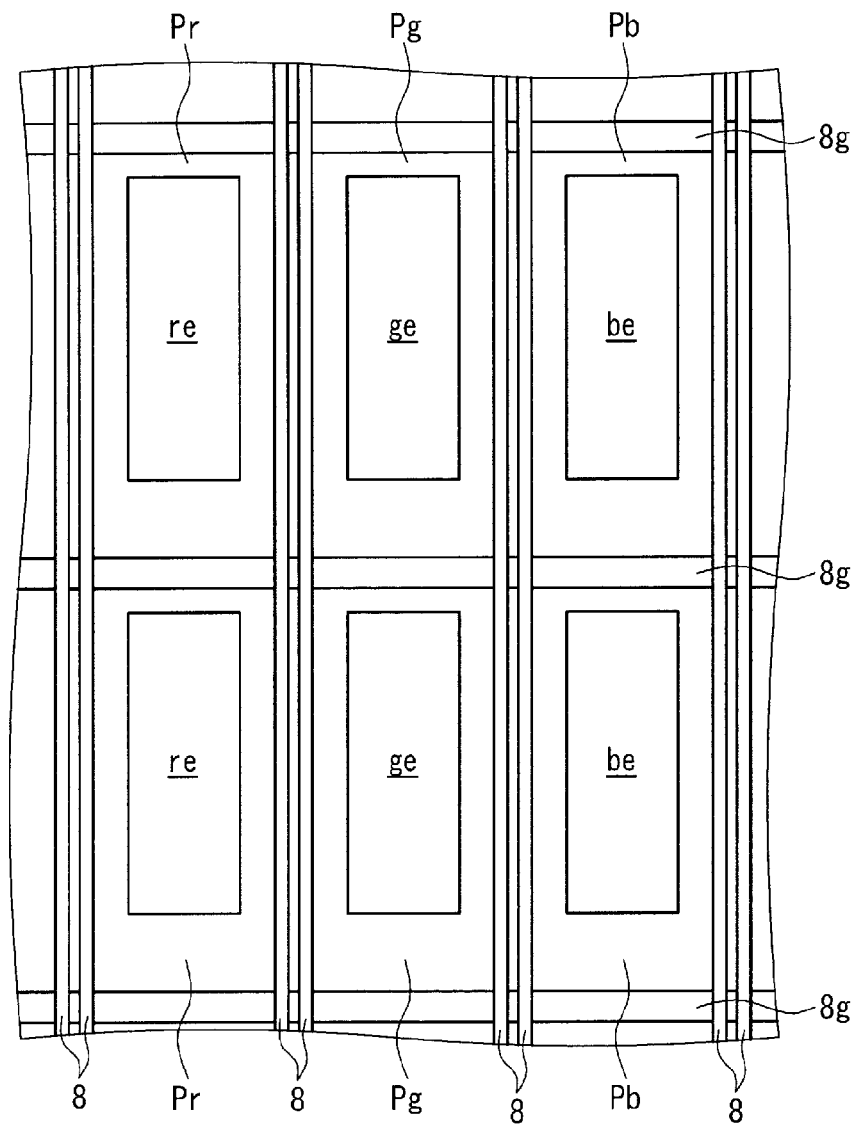
FIG. 2 is an enlarged plan view illustrating a pixel configuration of the organic EL display device described above.

Here, with reference to FIG. 2, the pixel area PA of the organic EL display device 1 of the present embodiment will be specifically described.

FIG. 2 is an enlarged plan view illustrating a pixel configuration of the organic EL display device described above.

As illustrated in FIG. 2, in the organic EL display device 1 of the present embodiment, in the pixel area PA (FIG. 1), red, green, and blue sub pixels Pr, Pg, and Pb (hereinafter referred to collectively as sub pixels P) that respectively emit red (R) light, green (G) light, and blue (B) light are provided in a matrix shape. Specifically, the plurality of sub pixels P are each partitioned by two of the wiring lines 8 and a gate line 8g connected to a gate of the TFT 7. More specifically, with respect to a pixel area of each of the sub pixels P, a dimension in the left-right direction in FIG. 2 is a dimension between a center line of the two wiring lines 8 disposed close to each other and a center line of the two wiring lines 8 that are adjacent, in the left-right direction in FIG. 2, to the two wiring lines 8 disposed close to each other. Further, a dimension in the up-down direction in FIG. 2 is a dimension between centers of the two gate lines 8g that are adjacent to each other. Further, a surface area of the pixel area of each of the sub pixels P is defined by the left-right dimension and the up-down dimension in the above-described FIG. 2.

Further, in the pixel area PA, a single pixel is configured by a set of the red, green, and blue sub pixels Pr, Pg, and Pb.

Further, in the red sub pixel Pr, a portion exposed from an opening re of the edge cover 10 configures an actual light emitting region of the red sub pixel Pr. Similarly, in the green sub pixel Pg, a portion exposed from an opening ge of the edge cover 10 configures an actual light emitting region of the green sub pixel Pg, and in the blue sub pixel Pb, a portion exposed from an opening be of the edge cover 10 configures an actual light emitting region of the blue sub pixel Pb.

Returning to FIG. 1, in the organic EL display device 1 of the present embodiment, at an end portion on one side (a lower side in FIG. 1) and an end portion on the other side (an upper side in FIG. 1) of the organic EL display device 1 in a film thickness direction (illustrated by "T" in FIG. 1), a first adjustment layer 16 and a second adjustment layer 24 for adjusting a neutral surface (illustrated by "C" in FIG. 1) of the organic EL display device 1 are provided.

This first adjustment layer 16 is fixed so as to cover a surface of the base material 2 on a lower side (a surface opposing a surface on which the foundation film 6 is provided) with a first adhesive material layer 15, provided at the end portion of the base material 2 on the lower side.

On the other hand, the second adjustment layer 24 is fixed above an opposite base material 22, which will be described later, provided on an upper side of the base material 2 with a fifth adhesive material layer 23, provided at the end portion of the base material 2 on the upper side.

Additionally, for the first adjustment layer 16 and the second adjustment layer 24, materials having the same thickness and the same Young's modulus (to be specific, having the Young's modulus of 1 GPa or greater, for example) are used. With this, in the organic EL display device 1 of the present embodiment, even in a case where the organic EL display device 1 is repeatedly bent, the first and second adjustment layers 16 and 24 appropriately adjust the above-described neutral surface C, and thus the organic EL display device 1 is configured such that abnormality such as damage or the like therein can be prevented from occurring.

Specifically, in the organic EL display device 1 of the present embodiment, for the first adjustment layer 16 and the second adjustment layer 24, a carbon material such as graphite, graphene, a carbon nanohorn, a carbon nanofiber, a carbon nanotube, or the like, for example, or a film in which these carbon materials are dispersed in an organic resin is used, the first and second adjustment layers 16 and 24 are bonded with the first and fifth adhesive material layers 15 and 23, respectively.

Additionally, for the above-described carbon material or the film in which these carbon materials are dispersed in the organic resin, a material having heat radiation characteristics, for example, having a value of thermal conductivity in a range of 0.15 to 20 W/m·K is used, and thus in the organic EL display device 1 of the present embodiment, the first and second adjustment layers 16 and 24 can efficiently radiate heat produced in the organic EL element 4 to the exterior.

Note that, in addition to the above description, the configuration may be such that the carbon material or a material in which these carbon materials are dispersed in the organic resin is directly film-formed on a surface of the base material 2 on the lower side and the upper face of the opposite base material 22 using application through screen printing or a slit coater, for example, to respectively provide the first and second adjustment layers 16 and 24.

Furthermore, the first and second adjustment layers 16 and 24 adjust a position of the neutral surface C such that a distance from the center position (illustrated by "M" in FIG. 1) of the organic EL display device 1 in a film thickness direction T to a position of the neutral surface before the adjustment becomes 1/n (n is a value greater than 1) times or smaller the distance (which will be described in detail later).

Additionally, in the organic EL display device 1 of the present embodiment, a color filter 18 is attached on an upper side of the sealing film 14 with a second adhesive material layer 17. Additionally, on an upper side of this color filter 18, a touch panel 20 is attached with a third adhesive material layer 19. Furthermore, on an upper side of the touch panel 20, the opposite base material 22 opposing the base material 2 is attached with a fourth adhesive material layer 21. Additionally, on an upper side of the opposite base material 22, as described above, the second adjustment layer 24 is attached with the fifth adhesive material layer 23.

In the color filter 18, color filter portions of the RGB (not illustrated) are provided at points respectively opposing the sub pixels Pr, Pg, and Pb of the above-described RGB, and improve light emission characteristics such as light emission quality or the like of the corresponding sub pixels Pr, Pg, and Pb.

Note that, in addition to the above description, provision of the color filter 18 may be omitted, or the color filter 18 may configure the sub pixels Pr, Pg, and Pb of the RGB using an organic EL element which emits only white light.

Additionally, the touch panel 20 is provided above the light emitting surface of the organic EL element 4, and detects a touch operation of a user to characters, graphics or the like displayed on the pixel area PA, instructions from the user can therefore be inputted.

Meanwhile, a flexible (bendable) film or the like is used for the opposite base material 22, in the same manner as the base material 2.

Note that, the second adhesive material layer 17 has also a function for filling concave-convex on the sealing film 14 and leveling. In other words, for example, by applying an ultraviolet-curing type low-viscosity application liquid as the second adhesive material layer 17 through a screen printing method or the like, the surface concave-convex on the sealing film 14 is leveled. The color filter 18 is bonded on the second adhesive material layer 17, and then curing by ultraviolet rays is performed.

Furthermore, each of the first to fifth adhesive material layers 15, 17, 19, 21, and 23 can also be provided with a dry function or a deoxidizing function through a method of mixing a desiccant or an oxygen scavenger or the like. With this, it is possible to prevent moisture or oxygen entering from the exterior from reaching the organic EL element 4 and prevent the organic EL element 4 from being damaged. In other words, by each of the first to fifth adhesive material layers 15, 17, 19, 21, and 23, sealing performance of the organic EL element 4 can be enhanced.

Figure 3:
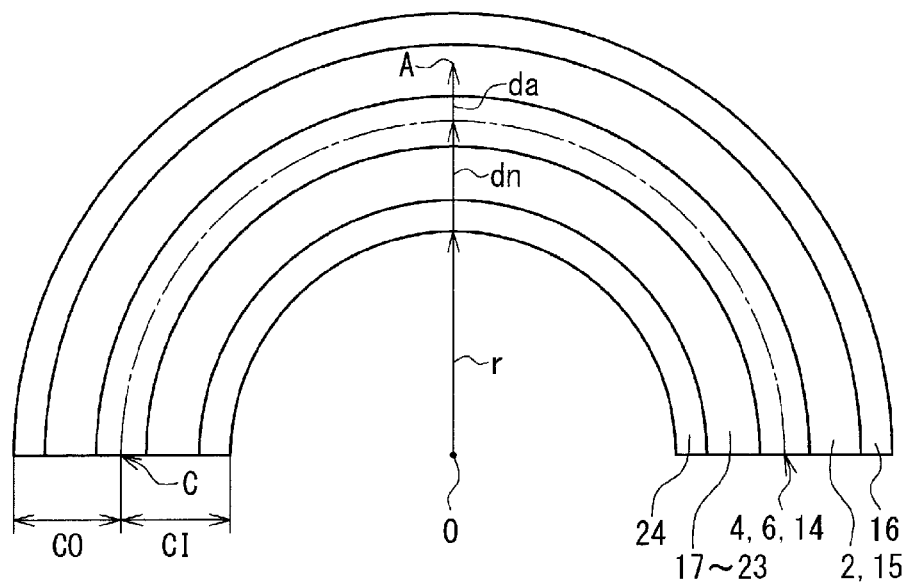
FIG. 3 is a diagram illustrating an adjustment method of a neutral surface by an adjustment layer illustrated in FIG. 1.
Figure 4:
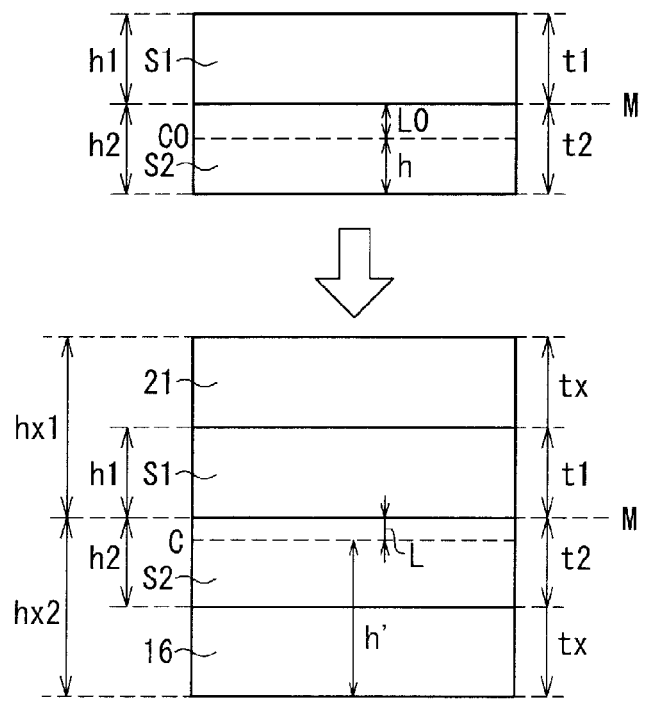
FIG. 4 is a diagram illustrating a specific adjustment method of a position of the neutral surface by first and second adjustment layers illustrated in FIG. 1.

Here, with reference to FIG. 3 and FIG. 4, the functions of the first and second adjustment layers 16 and 24 will be specifically described.

FIG. 3 is a diagram illustrating an adjustment method of the neutral surface by the adjustment layer illustrated in FIG. 1. FIG. 4 is a diagram illustrating a specific adjustment method of a position of the neutral surface by the first and second adjustment layers illustrated in FIG. 1.

First, using FIG. 3, the adjustment method of the neutral surface C by the first and second adjustment layers 16 and 24 will be specifically described.

In FIG. 3, the thickness and the Young's modulus of each of the first and second adjustment layers 16 and 24 are adjusted such that the neutral surface C of the organic EL display device 1 is positioned in the vicinity of the sealing film 14, in other words, in the vicinity of a position at which film breakage is easy to occur by distortion (extension) in a case where the organic EL display device 1 is bent.

Here, the neutral surface C of the organic EL display device 1 is a position in which the distortion does not occur in a case where the organic EL display device 1 is bent. To be specific, as illustrated in FIG. 3, in a case where the organic EL display device 1 is bent with a bending radius r with respect to a bending center O with the organic EL element 4 being put on an inner side, the neutral surface C of the organic EL display device 1 is formed at a position illustrated by a dot-dash line in FIG. 3 in accordance with the thickness and the Young's modulus of each of the layers included in the organic EL display device 1. This neutral surface C does not receive a tensile stress or a compression stress due to the bending, and the distortion (extension) thereof is 0.

Additionally, in an outer side of the neutral surface C (a range illustrated by "CO" in FIG. 3), each of the layers receives the tensile stress, and extends in a bending direction in accordance with the Young's modulus of each of the layers.

On the other hand, in an inner side of the neutral surface C (a range illustrated by "CI" in FIG. 3), each of the layers receives the compression stress, and shrinks in the bending direction in accordance with the Young's modulus of each of the layers.

Additionally, in the organic EL display device 1, a region in which the organic EL element 4 including the TFT 7 and the wiring lines 8, the sealing film 14, the foundation film 6, and the above-described moisture-proof layer are provided is a region in which the film breakage is particularly easy to occur when the organic EL display device 1 is bent. Additionally, in a case where the film breakage of any layer of the organic EL element 4, the sealing film 14, the foundation film 6, and the moisture-proof layer included in this region occurs, abnormality occurs in actions or characteristics of the organic EL display device 1, or penetration of moisture or oxygen occurs with ease.

Additionally, a thickness of the organic EL element 4, the sealing film 14, the foundation film 6, and the moisture-proof layer included in this region in the above-described film thickness direction T is approximately 10 μm, when this region is referred to as a function layer, it is necessary to design such that the neutral surface C is disposed at a position in the vicinity of the function layer in the organic EL display device 1. Specifically, it is required to control (adjust) the neutral surface C such that the maximum value of a distortion rate in the function layer is 1% or lower.

Additionally, a distortion rate Hr is obtained by the following Equation (1) using the above-described bending radius r, when a distance from a surface on the inner side to the neutral surface C is represented by dn, and a distance from the neutral surface C to an arbitrary point A is represented by da as illustrated in FIG. 3.

$$Hr = da \div (r+dn) \qquad (1)$$

Additionally, in the organic EL display device 1 of the present embodiment, by providing the first and second adjustment layers 16 and 24, the maximum value of the distortion rate in the above-described function layer is made 1% or lower. In other words, in the organic EL display device 1 of the present embodiment, the touch panel 20 or the like is provided so as to oppose the organic EL element 4, and therefore the neutral surface C moves to the touch panel 20 side. Accordingly, in the organic EL display device 1 of the present embodiment, by providing the first and second adjustment layers 16 and 24, the neutral surface C is adjusted to be positioned in the vicinity of the function layer, and the maximum value of the distortion rate in the function layer is made 1% or lower.

Next, with reference to FIG. 4, the position adjustment of the neutral surface C by the first and second adjustment layers 16 and 24 will be described in detail.

As illustrated in the upper side of FIG. 4, in a case where the first and second adjustment layers 16 and 24 are not provided, the position h of the neutral surface C0 from a surface of the innermost layer in a case where the organic EL display device 1 is bent (that is, a distance from the surface of the innermost layer to the neutral surface C0) is expressed by the following Expression (2), when a Young's modulus, a thickness, and a distance from the center position M of the organic EL display device 1 in the film thickness direction T to a surface on the outer side of each of the layers of m layers (m is an integer of 3 or greater) after excluding the first and second adjustment layers 16 and 24 from the plurality of layers included in the organic EL display device 1 are represented by $E_i$, $t_i$, and $h_i$, respectively.

[Expression 2]

$$h = \frac{\sum_{i=1}^{m} E_i t_i h_i}{\sum_{i=1}^{m} E_i t_i} \qquad (2)$$

Here, as illustrated in the upper side of FIG. 4, for the above-described m layers, when assuming a case of two layers S1 and S2 divided at the center position M of the organic EL display device 1 in the film thickness direction T, the following Equation (3) is satisfied.

$$h = (E_1 t_1 h_1 - E_2 t_2 h_2) \div 2(E_1 t_1 + E_2 t_2) \qquad (3)$$

Note that, $E_1$, $t_1$, and $h_1$ are respectively the Young's modulus, the thickness, and the distance from the above-described center position M to the surface on the outer side of the layer S1, also $E_2$, $t_2$, and $h_2$ are respectively the Young's modulus, the thickness, and the distance from the above-described center position M to the surface on the outer side of the layer S2.

Additionally, as illustrated in a lower side of FIG. 4, the position h' of the neutral surface C from the surface of the innermost layer (that is, a distance from the surface of the innermost layer to the neutral surface C) is expressed by the following Equation (4), in a case where the organic EL display device 1 is bent when the first and second adjustment layers 16 and 24 having the same Young's modulus $E_x$ and the same thickness $t_x$ are added to the layers S1 and S2, respectively.

$$h' = (E_1 t_1 h_1 - E_2 t_2 h_2 + E_x t_x h_{x1} - E_x t_x h_{x2}) \div 2(E_1 t_1 + E_2 t_2 + 2 E_x t_x) \qquad (4)$$

Here, the distance $h_{x1}$ from the above-described center position M to the surface of the second adjustment layer 24 on the outer side and the distance $h_{x2}$ from the above-described center position M to the surface of the first adjustment layer 16 on the outer side are the same value, and thus the above-described Equation (4) becomes the following Equation (5).

$$h' = (E_1 t_1 h_1 - E_2 t_2 h_2) \div 2(E_1 t_1 + E_2 t_2 + 2 E_x t_x) \qquad (5)$$

Additionally, in a case of making the position h of the neutral surface C0 before providing the first and second adjustment layers 16 and 24 1/n times (n is a value greater than 1) or smaller the distance by providing the first and second adjustment layers 16 and 24, h/n≥h' is satisfied. In other words, as illustrated in the upper side of FIG. 4, for the distance L0 from the above-described center position M to the neutral surface C0 and the distance L from the above-described center position M to the neutral surface C after providing the first and second adjustment layers 16 and 24, L0/n≥L is satisfied.

Accordingly, by applying the above-described Equation (3) and Equation (5) to h/n≥h', Inequality (a) below is obtained.

$$n - 1 \leq 2 E_x t_x \div (E_1 t_1 + E_2 t_2) \qquad (a)$$

By applying this Inequality (a) to the configuration of m layers, Inequality (1) below is obtained.

[Expression 1]

$$n - 1 \leq \frac{2 E_x t_x}{\sum_{i=1}^{m} E_i t_i} \qquad (1)$$

As described above, in the organic EL display device 1 of the present embodiment, the first and second adjustment layers 16 and 24 adjust the position of the neutral surface C such that a distance from the center position M of the organic EL display device 1 in the film thickness direction T to the position of the neutral surface C0 before providing the first and second adjustment layers 16 and 24 becomes 1/n times or smaller the distance, when a value satisfying Inequality (1) and being greater than 1 is represented by n.

Note that, in the above description, although the case where the organic EL display device 1 is bent with the organic EL element 4 being put on the inner side is described, even in a case where the organic EL display device 1 is bent with the organic EL element 4 being put on the outer side, the above-described distortion rate Hr has the same value, and thus the adjustment function of the neutral surface C by the first and second adjustment layers 16 and 24 is obtained in the same manner.

Figure 5:
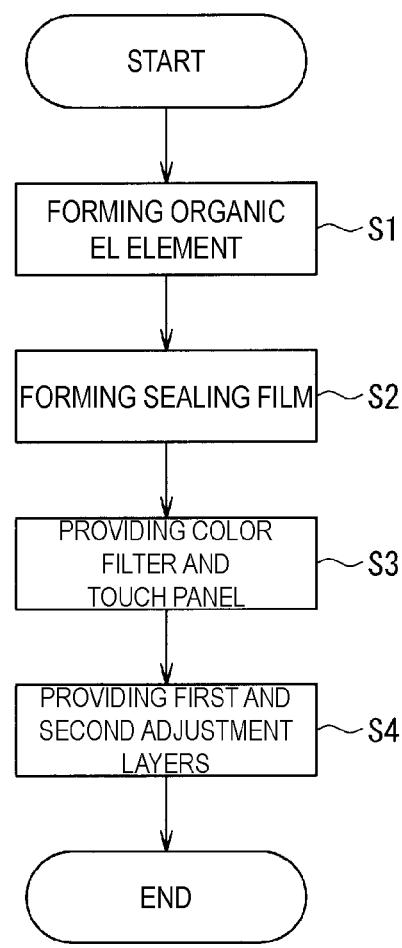
FIG. 5 is a flowchart illustrating a production process of the organic EL display device described above.

Next, using FIG. 5, the method for producing the organic EL display device 1 of the present embodiment will be specifically described.

FIG. 5 is a flowchart illustrating production processes of the above-described organic EL display device.

As illustrated in step S1 in FIG. 5, in the organic EL display device 1 of the present embodiment, first, a process for forming an organic EL element is performed to form the organic EL element 4 on the base material 2. Specifically, after the foundation film 6, the above-described moisture-proof layer, and a TFT layer including the TFT 7, the wiring lines 8 and the like being sequentially formed on the surface of the base material 2, the portions of the organic EL element 4 such as the first electrode 11 and the like are sequentially provided, and then the organic EL element 4 is formed.

Next, as illustrated in step S2 in FIG. 5, a process for forming a sealing film is performed to form the sealing film 14 that seals the organic EL element 4. Specifically, for example, by using a Chemical Vapor Deposition (CVD) method, an Atomic Layer Deposition (ALD) method, or the like, the first inorganic layer 14a is formed so as to cover the organic EL element 4. Subsequently, for example, by using vapor deposition, sputtering, or the like, the first organic layer 14b is formed on the first inorganic layer 14a. Finally, for example, by using the CVD, the ALD method, or the like, the second inorganic layer 14c is formed on the first organic layer 14b, and then film formation of the sealing film 14 is completed.

Subsequently, as illustrated in step S3 of FIG. 5, a process for providing a color filter and a touch panel is performed to provide the color filter 18 and the touch panel 20. Specifically, the color filter 18 and the touch panel 20 are fixed on the upper side of the sealing film 14 with the second adhesive material layer 17 and the third adhesive material layer 19, respectively, interposed therebetween.

Next, as illustrated in step S4 in FIG. 5, a process for providing first and second adjustment layers is performed to provide the first and second adjustment layers 16 and 24. Specifically, the first adjustment layer 16 is provided at the end portion of the base material 2 on the lower side with the first adhesive material layer 15 interposed therebetween. Additionally, after the opposite base material 22 is fixed on the touch panel 20 with the fourth adhesive material layer 21 interposed therebetween, the second adjustment layer 24 is fixed to the opposite base material 22 with the fifth adhesive material layer 23 interposed therebetween, and provided at the end portion of the base material 2 on the upper side.

Additionally, in this process for providing the first and second adjustment layers, by providing the first and second adjustment layers 16 and 24, the position of the neutral surface C is adjusted such that the distance from the center position M of the organic EL display device 1 in the film thickness direction T to the position of the neutral surface C0 before providing the first and second adjustment layers 16 and 24 (that is, before the adjustment) becomes 1/n times or smaller the distance, when a value satisfying the above-described Inequality (1) and being greater than 1 is represented by n.

In the case of the organic EL display device 1 configured as stated above according to the present embodiment, the sealing film 14 seals the organic EL element (electroluminescence element) 4. Additionally, the first adjustment layer 16 is provided at the end portion of the organic EL display device 1 on the one side in the film thickness direction T to adjust the neutral surface C of the organic EL display device 1. Additionally, the second adjustment layer 24 is provided at the end portion of the organic EL display device 1 on the other side in the film thickness direction T to adjust the neutral surface C of the organic EL display device 1. Furthermore, for the first adjustment layer 16 and the second adjustment layer 24, the materials having the same thickness and the same Young's modulus are used. Thus, unlike the known example stated above, in the present embodiment, this allows the organic EL display device (electroluminescence device) 1 with excellent reliability to be configured that can prevent abnormality from occurring even in a case where the number of the plurality of layers included in the device is increased.

Here, examples of results of simulations performed by the authors or the like of the present disclosure of the present application will be specifically described. Note that, in the following simulations, a case where the foundation film 6 is not provided and a moisture-proof film is directly provided between the base material 2 and the above-described TFT layer will be described.

In the simulations, for a product of the present embodiment, a comparative product 1 in which the first and second adjustment layers 16 and 24 and the first and fifth adhesive material layers 15 and 23 for respectively providing these adjustment layers were not provided, a comparative product 2 in which the first adjustment layer 16 and the first adhesive material layer 15 were not provided, and a comparative product 3 in which the second adjustment layer 24 and the fifth adhesive material layer 23 were not provided, in a case where each of the products was bent with a curvature radius of 3.5 mm, it was confirmed whether film breakage occurred.

Additionally, the Young's modulus and the thickness shown in Table 1 were used for each of the portions used for these simulations. Additionally, in the product of the present embodiment, with the configuration shown in Table 1, the value of n in the above-described Inequality (1) was set to 1.6. In other words, in the product of the present embodiment, the distance from the above-described center position M to the position of the neutral surface C was set to 1/1.6 times the distance before providing the first and second adjustment layers 16 and 24 (that is, the distance in the above-described comparative product 1).

TABLE 1

|  | Young's Modulus (GPa) | Thickness (μm) |
|---|---|---|
| Second Adjustment Layer | 11.0 | 20.00 |
| Fifth Adhesive Material Layer | 3.0 | 15.00 |
| Opposite Base Material | 4.0 | 20.00 |
| Fourth Adhesive Material Layer | 3.0 | 15.00 |
| Touch Panel | 7.7 | 16.00 |
| Third Adhesive Material Layer | 3.0 | 15.00 |
| Color Filter | 3.0 | 15.00 |
| Second Adhesive Material Layer | 3.0 | 15.00 |
| Sealing Film | 80.0 | 3.50 |

TABLE 1-continued

|  | Young's Modulus (GPa) | Thickness (μm) |
| --- | --- | --- |
| Organic EL Element | 0.0 | 0.50 |
| TFT Layer | 3.0 | 5.00 |
| Moisture-proof Layer | 240.0 | 0.50 |
| Base Material | 7.7 | 12.00 |
| First Adhesive Material Layer | 3.0 | 15.00 |
| First Adjustment Layer | 11.0 | 20.00 |

Next, examples of these simulation results will be shown in Table 2.

TABLE 2

|  |  | Product of Present Embodiment | Comparative Product 1 | Comparative Product 2 | Comparative Product 3 |
| --- | --- | --- | --- | --- | --- |
| Existence/Nonexistence of Film Breakage | | Nonexistence | Existence (breakage at touch panel) | Existence (breakage at moisture-proof layer) | Existence (breakage at touch panel) |
| Neutral Surface Position (μm) | | −11.8 | −18.8 | 4.0 | −33.0 |
| Distortion Rate (%) | Touch Panel | 1.01 | 1.2 | 0.56 | 1.6 |
| | Moisture-proof Layer | −0.99 | −0.78 | −1.43 | −0.39 |

As is clear from Table 2, it was confirmed that the film breakage did not occur only in the product of the present embodiment in which both the first and second adjustment layers 16 and 24 were provided. In other words, it was actually proved that the film breakage occurred not only in the comparative product 1 in which both the first and second adjustment layers 16 and 24 were not provided, but also in the comparative product 2 in which only the second adjustment layer 24 was provided and the comparative product 3 in which only the first adjustment layer 16 was provided, and the film breakage did not occur only after both the first and second adjustment layers 16 and 24 were provided.

Additionally, in the present embodiment, the first and second adjustment layers 16 and 24 adjust the position of the neutral surface C such that the distance from the center position M of the organic EL display device 1 in the film thickness direction T to the position of the neutral surface C0 before providing the first and second adjustment layers 16 and 24 becomes 1/n times or smaller the distance, when the value satisfying Inequality (1) and being greater than 1 is represented by n. With this, in the present embodiment, by the first and second adjustment layers 16 and 24, the position of the neutral surface C can be reliably brought close to the center position M of the organic EL display device 1 in the film thickness direction T, and thus, even in a case where the organic EL display device 1 is bent, it is possible to reliably prevent abnormality from occurring.

Additionally, in the present embodiment, for each of the first and second adjustment layers 16 and 24, a carbon material or a material with a carbon material being dispersed in an organic resin is used. With this, in the present embodiment, each of the first and second adjustment layers 16 and 24 is configured of a material with a high Young's modulus, and thus each of the first and second adjustment layers 16 and 24 can be reduced in the thickness, and the organic EL display device 1 can be reduced in the thickness with ease.

Furthermore, in the present embodiment, the Young's modulus and the thickness of each of the first and second adjustment layers 16 and 24 are preferably 1 to 30 GPa and 5 to 100 μm, respectively.

Additionally, in the present embodiment, as a carbon material of each of the first and second adjustment layers 16 and 24, graphite, graphene, a carbon nanohorn, a carbon nanofiber, or a carbon nanotube is used. With this, in the present embodiment, a material having high thermal conductivity is used for each of the first and second adjustment layers 16 and 24, and thus heat from the organic EL element 4 can be more efficiently radiated to the exterior.

Additionally, in the present embodiment, the touch panel 20 is provided between the first and second adjustment layers 16 and 24. Accordingly, in the present embodiment, the organic EL display device 1 with the touch panel 20 having excellent bendability and reliability can be configured with ease.

Second Embodiment

Figure 6:
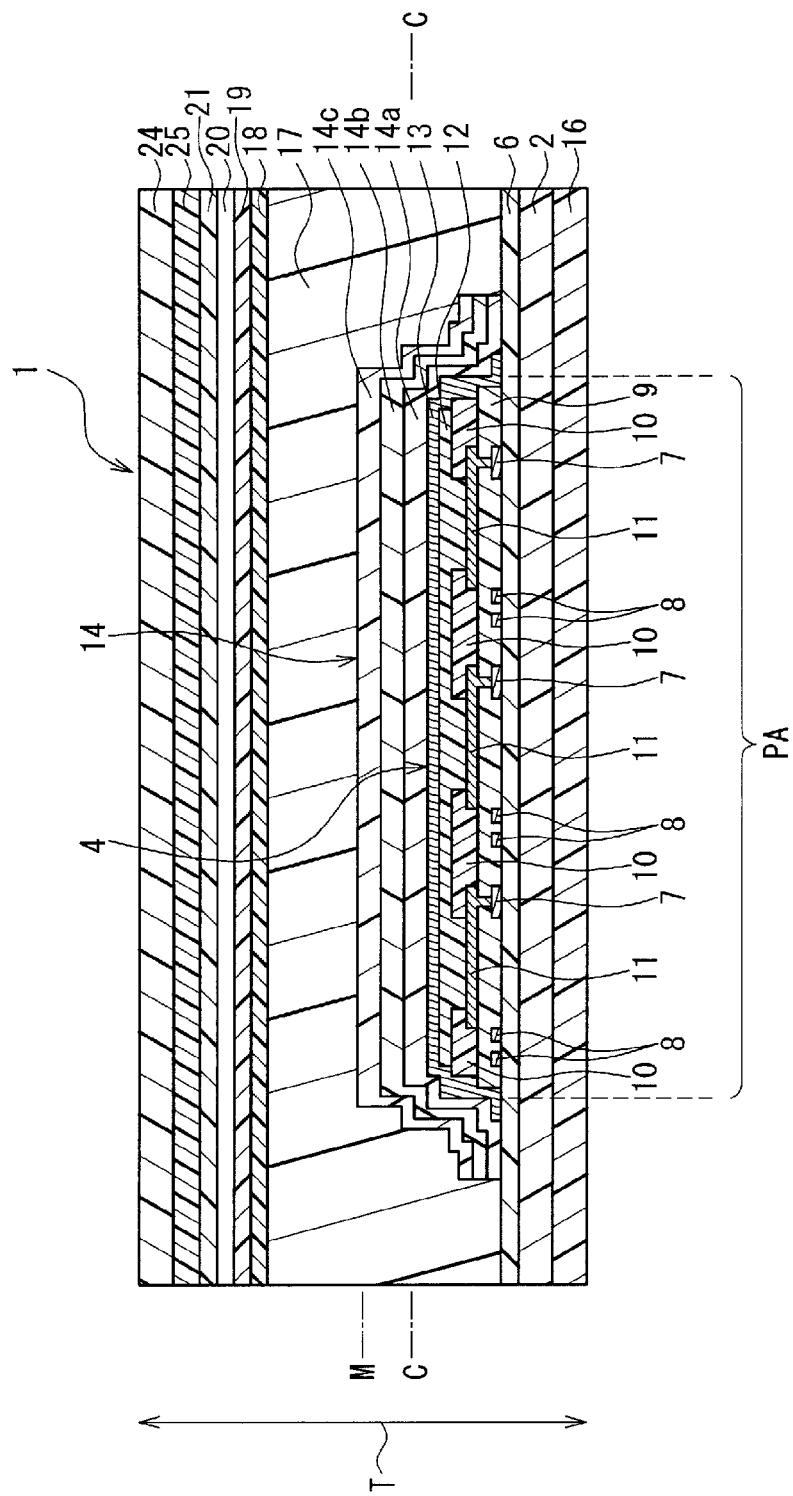
FIG. 6 is a cross-sectional view illustrating a cross section of an organic EL display device according to a second embodiment of the disclosure.

FIG. 6 is a cross-sectional view illustrating a cross section of an organic EL display device according to a second embodiment of the disclosure.

In the drawing, a main point of difference between the present embodiment and the first embodiment described above is that an inorganic layer is used for each of the first and second adjustment layers. Note that elements common to those in the first embodiment are denoted by the same reference signs, and duplicated description thereof will be omitted.

In other words, as illustrated in FIG. 6, in the organic EL display device 1 of the present embodiment, the first adjustment layer 16 is directly provided on the surface of the base material 2 on the lower side. Additionally, a protective film 25 is provided on the touch panel 20. Additionally, the second adjustment layer 24 is directly provided on a surface of the protective film 25 on an upper side. In other words, in the organic EL display device 1 of the present embodiment, unlike the device in the first embodiment, each of the first and second adjustment layers 16 and 24 is directly formed using the CVD method or the like as described below, and therefore the adhesive material layer is not used.

Additionally, in the organic EL display device 1 of the present embodiment, for each of the first and second adjustment layers 16 and 24, an inorganic layer such as silicon nitride (SiNx), silicon oxide (SiOx), silicon oxynitride (SiON), aluminum oxide (AlOx), or the like is used.

Furthermore, in the organic EL display device 1 of the present embodiment, for example, by using the CVD method, the ALD method or the like, each of the first and second adjustment layers 16 and 24 is directly formed on the corresponding surface.

With the configuration stated above, the present embodiment can achieve operation and effect similar to those of the first embodiment.

Here, examples of results of simulations performed by the authors or the like of the disclosure of the present application will be specifically described. Note that, in the following simulations, in the same manner as those in the first embodiment, a case where the foundation film 6 is not provided and the moisture-proof film is directly provided between the base material 2 and the above-described TFT layer will be described.

In the simulations, for the product of the present embodiment, a comparative product 4 in which the first and second adjustment layers 16 and 24 were not provided, a comparative product 5 in which the first adjustment layer 16 was not provided, and a comparative product 6 in which the second adjustment layer 24 was not provided, in a case where each of the products was bent with a curvature radius of 3.5 mm, it was confirmed whether film breakage occurred.

Additionally, the Young's modulus and the thickness shown in Table 3 were used for each of the portions used for these simulations. Additionally, in the product of the present embodiment, with the configuration shown in Table 3, the value of n in the above-described Inequality (1) was set to 1.5. In other words, in the product of the present embodiment, the distance from the above-described center position M to the position of the neutral surface C was set to 1/1.5 times the distance before providing the first and second adjustment layers 16 and 24 (that is, the distance in the above-described comparative product 4).

TABLE 3

| | Young's Modulus (GPa) | Thickness (μm) |
|---|---|---|
| Second Adjustment Layer | 80.0 | 3.00 |
| Protective Film | 4.0 | 20.00 |
| Fourth Adhesive Material Layer | 3.0 | 15.00 |
| Touch Panel | 7.7 | 16.00 |
| Third Adhesive Material Layer | 3.0 | 15.00 |
| Color Filter | 3.0 | 15.00 |
| Second Adhesive Material Layer | 3.0 | 15.00 |
| Sealing Film | 80.0 | 3.50 |
| Organic EL Element | 0.0 | 0.50 |
| TFT Layer | 3.0 | 5.00 |
| Moisture-proof Layer | 240.0 | 0.50 |
| Base Material | 7.7 | 12.00 |
| First Adjustment Layer | 80.0 | 3.00 |

Next, examples of these simulation results will be shown in Table 4.

TABLE 4

| | | Product of Present Embodiment | Comparative Product 4 | Comparative Product 5 | Comparative Product 6 |
|---|---|---|---|---|---|
| Existence/Nonexistence of Film Breakage | | Nonexistence | Existence (breakage at touch panel) | Existence (breakage at moisture-proof layer) | Existence (breakage at touch panel) |
| Neutral Surface Position (μm) | | −12.1 | −18.5 | −2.0 | −27.3 |
| Distortion Rate (%) | Touch Panel | 1.01 | 1.2 | 0.73 | 1.44 |
| | Moisture-proof Layer | −0.98 | −0.8 | −1.26 | −0.55 |

As is clear from Table 4, it was confirmed that the film breakage did not occur only in the product of the present embodiment in which both the first and second adjustment layers 16 and 24 were provided. In other words, it was actually proved that the film breakage occurred not only in the comparative product 4 in which both the first and second adjustment layers 16 and 24 were not provided, but also in the comparative product 5 in which only the second adjustment layer 24 was provided and the comparative product 6 in which only the first adjustment layer 16 was provided, and the film breakage did not occur only after both the first and second adjustment layers 16 and 24 were provided.

Additionally, in the present embodiment, for each of the first and second adjustment layers 16 and 24, the inorganic layer is used. With this, in the present embodiment, without using the adhesive material layer, each of the first and second adjustment layers 16 and 24 can be provided, and thus the organic EL display device 1 can be reduced in the thickness with ease.

Additionally, in the present embodiment, for the inorganic layer of each of the first and second adjustment layers 16 and 24, silicon nitride (SiNx), silicon oxide (SiOx), silicon oxynitride (SiON), or aluminum oxide (AlOx) is used. With this, in the present embodiment, the organic EL display device 1 with an excellent barrier property capable of preventing moisture, oxygen, or the like from penetrating from the exterior with ease can be configured with ease.

Furthermore, in the present embodiment, the Young's modulus and the thickness of each of the first and second adjustment layers 16 and 24 are preferably 80 to 300 GPa and 10 nm to 5 μm, respectively.

Third Embodiment

Figure 7:
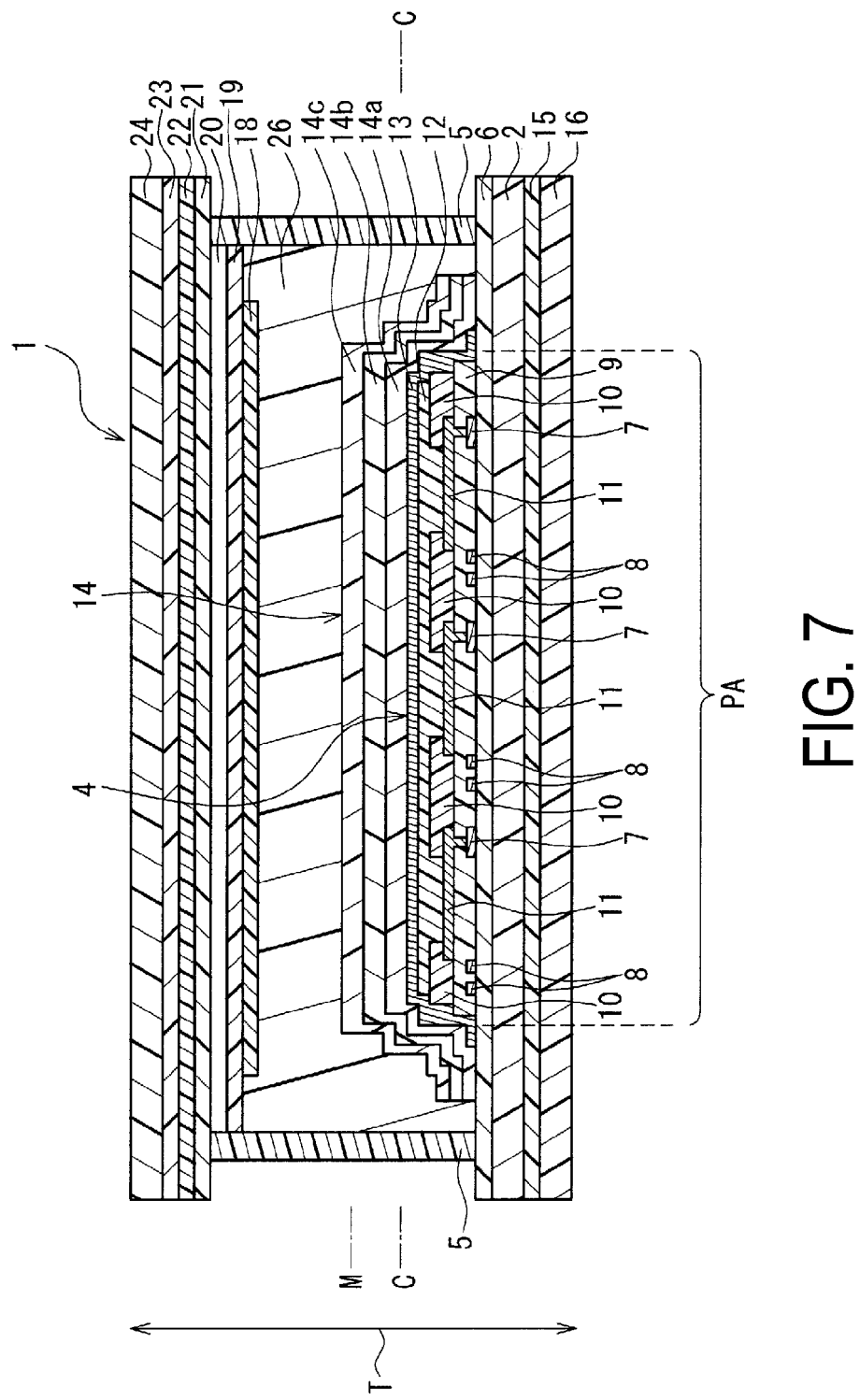
FIG. 7 is a cross-sectional view illustrating a cross section of an organic EL display device according to a third embodiment of the disclosure.

FIG. 7 is a cross-sectional view illustrating a cross section of an organic EL display device according to a third embodiment of the disclosure.

In the drawing, a main difference between the present embodiment and the first embodiment is that a frame shaped sealing material for sealing the organic EL element is provided between the base material and the opposite base material. Note that elements common to those in the first embodiment are denoted by the same reference signs, and duplicated description thereof will be omitted.

In other words, as illustrated in FIG. 7, in the organic EL display device 1 according to the present embodiment, the organic EL element 4 is sealed by the base material 2, the opposite base material 22 provided opposing the base material 2, and a sealing material 5 having a frame shape provided between the base material 2 and the opposite base material 22.

The sealing material 5 is formed by spacers defining a cell gap from the base material 2 to the opposite base material 22 along with inorganic particles dispersed in a resin such as an epoxy resin, for example, and the sealing material 5 is formed in a frame shape in the periphery of the pixel area PA. Dispersing the inorganic particles through the sealing material 5 makes it possible to further reduce moisture permeability.

Additionally, in the organic EL display device 1 of the present embodiment, a filling material layer 26 is provided among the base material 2, the opposite base material 22, and the sealing material 5 so as to cover the organic EL element 4. A material in which a metal oxide such as aluminum hydroxide or calcium oxide, activated carbon, or the like is dispersed in a resin is used, for example, for the filling material layer 26.

With the configuration stated above, the present embodiment can achieve operation and effect similar to those of the first embodiment.

Here, examples of results of simulations performed by the authors or the like of the disclosure of the present application will be specifically described. Note that, in the following simulations, in the same manner as those in the first embodiment, a case where the foundation film 6 is not provided and the moisture-proof film is directly provided between the base material 2 and the above-described TFT layer will be described.

In the simulations, for the product of the present embodiment, a comparative product 7 in which the first and second adjustment layers 16 and 24 and the first and fifth adhesive material layers 15 and 23 for respectively providing these adjustment layers were not provided, a comparative product 8 in which the first adjustment layer 16 and the first adhesive material layer 15 were not provided, and a comparative product 9 in which the second adjustment layer 24 and the fifth adhesive material layer 23 were not provided, in a case where each of the products was bent with a curvature radius of 3 mm, it was confirmed whether or not film breakage occurred.

Additionally, the Young's modulus and the thickness shown in Table 5 were used for each of the portions used for these simulations. Additionally, in the product of the present embodiment, with the configuration shown in Table 5, the value of n in the above-described Inequality (1) was set to 1.3. In other words, in the product of the present embodiment, the distance from the above-described center position M to the position of the neutral surface C was set to 1/1.3 times the distance before providing the first and second adjustment layers 16 and 24 (that is, the distance in the above-described comparative product 7).

TABLE 5

| | Young's Modulus (GPa) | Thickness (μm) |
|---|---|---|
| Second Adjustment Layer | 10.0 | 14.00 |
| Fifth Adhesive Material Layer | 3.0 | 15.00 |
| Opposite Base Material | 4.0 | 20.00 |
| Fourth Adhesive Material Layer | 3.0 | 15.00 |
| Touch Panel | 7.7 | 16.00 |
| Third Adhesive Material Layer | 3.0 | 15.00 |
| Color Filter | 3.0 | 5.00 |
| Filling Material Layer | 3.0 | 6.00 |
| Sealing Film | 80.0 | 3.50 |
| Organic EL Element | 0.0 | 0.50 |
| TFT Layer | 3.0 | 5.00 |
| Moisture-proof Layer | 240.0 | 0.50 |
| Base Material | 7.7 | 12.00 |
| First Adhesive Material Layer | 3.0 | 15.00 |
| First Adjustment Layer | 10.0 | 14.00 |

Next, examples of these simulation results will be shown in Table 6.

TABLE 6

| | | Product of Present Embodiment | Comparative Product 7 | Comparative Product 8 | Comparative Product 9 |
|---|---|---|---|---|---|
| Existence/Nonexistence of Film Breakage | | Nonexistence | Existence (breakage at touch panel) | Existence (breakage at moisture-proof layer) | Existence (breakage at touch panel) |
| Neutral Surface Position (μm) | | −12.2 | −17.4 | −1.7 | −23.4 |
| Distortion Rate (%) | Touch Panel | 1.04 | 1.21 | 0.69 | 1.4 |
| | Moisture-proof Layer | −0.99 | −0.82 | −1.33 | −0.62 |

As is clear from Table 6, it was confirmed that the film breakage did not occur only in the product of the present embodiment in which both the first and second adjustment layers 16 and 24 were provided. In other words, it was actually proved that the film breakage occurred not only in the comparative product 7 in which both the first and second adjustment layers 16 and 24 were not provided, but also in the comparative product 8 in which only the second adjustment layer 24 was provided and the comparative product 9 in which only the first adjustment layer 16 was provided, and the film breakage did not occur only after both the first and second adjustment layers 16 and 24 were provided.

Additionally, in the present embodiment, the frame shaped sealing material 5 for sealing the organic EL element 4 is included between the base material 2 and the opposite base material 22. With this, in the present embodiment, deterioration in the organic EL element 4 can be more reliably prevented.

Furthermore, in the present embodiment, the Young's modulus and the thickness of each of the first and second adjustment layers 16 and 24 are preferably 1 to 30 GPa and 5 to 100 μm, respectively.

Note that all the embodiments stated above are given only as examples, and are not given for limitation. The technical scope of the disclosure is defined by Claims, and all modifications made within the scope equivalent to the configuration stated in Claims are included in the technical scope of the disclosure.

For example, in the description above, description has been made of a case where an organic EL element is used as an electroluminescence element. However, the disclosure is not limited to this. For example, it may be possible to use an inorganic EL element including an inorganic compound.

In addition, in the description above, description has been made of a case where the organic EL display device includes the touch panel. However, the disclosure is not limited to this. For example, the disclosure may be applied to a display device not provided with the touch panel or an illumination device such as a backlight device.

Additionally, in the description above, description has been made of a case where the sealing film formed of the organic layer and two inorganic layers is used. However, the sealing film of the disclosure is not limited to this. Note that, as in the above-described embodiment, the case where the sealing film is configured of the layered structure of the organic layer and the inorganic layer is more preferable in a point that the sealing performance for the electroluminescence element can be improved with ease.

Additionally, in the description above, description has been made of a case where the material having the Young's modulus of 1 GPa or greater is used for the first and second adjustment layers. However, the first and second adjustment layers of the disclosure are not limited to this, and may be layers using materials having the same thickness and the same Young's modulus. Additionally, it is not necessary for the thicknesses and the Young's modulus of each of the first and second adjustment layers to completely match with each other, the thicknesses and the Young's modulus of each of the first and second adjustment layers are each allowed to have errors within approximately 3% from each other.

Note that, as in the above-described embodiments, the case where a material having the Young's modulus of 1 GPa or greater is used for the first and second adjustment layers is more preferable in a point that the position of the neutral surface can be adjusted with ease without increasing the thickness of each of the first and second adjustment layers.

In addition, in the description above, description has been made of a case where application is made to an active-matrix type organic EL display device including the thin film transistor (TFT). However, the disclosure is not limited to this. The disclosure may be applied to a passive matrix type organic EL display device not having any thin film transistor provided therein.

Further, in addition to the above description, the first to third embodiments described above may be combined as appropriate.

INDUSTRIAL APPLICABILITY

The disclosure is useful in an electroluminescence device with excellent reliability capable of preventing abnormality from occurring even in a case where the number of a plurality of layers included in the device is increased and a method for producing the electroluminescence device.

REFERENCE SIGNS LIST

1 Organic EL display device
2 Base material
4 Organic EL element (electroluminescence element)
5 Sealing material
16 First adjustment layer
20 Touch panel
22 Opposite base material
24 Second adjustment layer
T Film thickness direction
C Neutral surface
M Center position

The invention claimed is:
1. An electroluminescence device comprising:
a base material having flexibility; and
a plurality of layers including a function layer including an electroluminescence element provided on the base material,
the plurality of layers further including:
a sealing film configured to seal the electroluminescence element;
a first adjustment layer provided at an end portion of the electroluminescence device on one side in a film thickness direction and configured to adjust a neutral surface of the electroluminescence device; and
a second adjustment layer provided at an end portion of the electroluminescence device on another side in the film thickness direction and configured to adjust a neutral surface of the electroluminescence device, wherein
the first adjustment layer and the second adjustment layer use such materials that have a same thickness and a same Young's modulus; and
the first adjustment layer and the second adjustment layer adjust a maximum value of a distortion rate in the function layer to be 1% or less.

2. The electroluminescence device according to claim 1, wherein the first and second adjustment layers adjust a position of the neutral surface to a position with a distance from a center position of the electroluminescence device in the film thickness direction to a position of the neutral surface becoming 1/n times or smaller the distance, when a value satisfying Inequality (1) and being greater than 1 is represented by n:

[Expression 1]

$$n - 1 \leq \frac{2 E_x t_x}{\sum_{i=1}^{m} E_i t_i} \quad (1)$$

where,
$E_x$ and $t_x$ are a Young's modulus and a thickness, respectively, of each of the first and second adjustment layers, m is a number of layers included in the plurality of layers after excluding the first and second adjustment layers from the plurality of layers, and $E_i$ and $t_i$ are a Young's modulus and a thickness, respectively, of each of the plurality of layers excluding the first and second adjustment layers.

3. The electroluminescence device according to claim 1, wherein, for each of the first and second adjustment layers, a material having a Young's modulus of 1 GPa or greater is used.

4. The electroluminescence device according to claim 1, wherein, for each of the first and second adjustment layers, a carbon material or a material with a carbon material being dispersed in an organic resin is used.

5. The electroluminescence device according to claim 4, wherein for the carbon material of each of the first and second adjustment layers, graphite, graphene, a carbon nanohorn, a carbon nanofiber, or a carbon nanotube is used.

6. The electroluminescence device according to claim 1, wherein, for each of the first and second adjustment layers, an inorganic layer is used.

7. The electroluminescence device according to claim 6, wherein, for the inorganic layer of each of the first and second adjustment layers, silicon nitride (SiNx), silicon oxide (SiOx), silicon oxynitride (SiON), or aluminum oxide (AlOx) is used.

8. The electroluminescence device according to claim 1, the electroluminescence device comprising:
    an opposite base material opposing the base material on the electroluminescence element side; and
    a sealing material having a frame shape and configured to seal the electroluminescence element from the base material to the opposite base material.

9. The electroluminescence device according to claim 1, wherein a touch panel is provided between the first adjustment layer and the second adjustment layer.

10. A method for producing an electroluminescence device including a base material having flexibility and a plurality of layers including a function layer including an electroluminescence element provided on the base material, the method comprising:
    forming a sealing film to form a sealing film configured to seal the electroluminescence element; and
    providing first and second adjustment layers to respectively provide a first adjustment layer and a second adjustment layer configured of materials having a same thickness and a same Young's modulus and configured to adjust a neutral surface of the electroluminescence device at an end portion on one side and an end portion on another side of the electroluminescence device in a film thickness direction, and to adjust a maximum value of a distortion rate in the function layer to be 1% or less.

11. The method for producing the electroluminescence device according to claim 10, wherein, in the providing first and second adjustment layers, by providing the first and second adjustment layers, a position of the neutral surface is adjusted to a position with a distance from a center position of the electroluminescence device in a film thickness direction to the position of the neutral surface becoming 1/n times or smaller the distance, when a value satisfying Inequality (1) and being greater than 1 is represented by n:

[Expression 1]

$$n - 1 \leq \frac{2E_x t_x}{\sum_{i=1}^{m} E_i t_i} \quad (1)$$

where, $E_x$ and $t_x$ are a Young's modulus and a thickness, respectively, of each of the first and second adjustment layers, m is a number of layers included in the plurality of layers after excluding the first and second adjustment layers from the plurality of layers, and $E_i$ and $t_i$ are a Young's modulus and a thickness, respectively, of each of the plurality of layers excluding the first and second adjustment layers.

* * * * *